United States Patent
Hofmann

(10) Patent No.: US 7,498,697 B2
(45) Date of Patent: Mar. 3, 2009

(54) MARX GENERATOR

(75) Inventor: Helmut Hofmann, Gräfenberg (DE)

(73) Assignee: Diehl BGT Defence GmbH & Co., KG, Überlingen (DE)

( * ) Notice: Subject to any disclaimer, the term of this patent is extended or adjusted under 35 U.S.C. 154(b) by 115 days.

(21) Appl. No.: 11/578,478

(22) PCT Filed: Apr. 1, 2005

(86) PCT No.: PCT/EP2005/003443

§ 371 (c)(1),
(2), (4) Date: Oct. 13, 2006

(87) PCT Pub. No.: WO2005/101659

PCT Pub. Date: Oct. 27, 2005

(65) Prior Publication Data

US 2007/0216230 A1    Sep. 20, 2007

(30) Foreign Application Priority Data

Apr. 13, 2004   (DE) .................... 10 2004 017 875

(51) Int. Cl.
   *H03K 3/00*    (2006.01)

(52) U.S. Cl. ..................................... 307/106

(58) Field of Classification Search ........... 307/108, 307/106
See application file for complete search history.

(56) References Cited

U.S. PATENT DOCUMENTS

| 3,248,574 | A |   | 4/1966  | Covington |
| 3,505,533 | A | * | 4/1970  | Bernstein et al. ............ 307/110 |
| 3,832,569 | A | * | 8/1974  | Anderson et al. ........... 307/110 |
| 5,254,968 | A | * | 10/1993 | Zirnheld ..................... 338/50 |
| 6,822,394 | B2|   | 11/2004 | Staines et al. |

FOREIGN PATENT DOCUMENTS

| DE | 35 16 153 A1 |   | 1/2007 |
| JP | 62-164900    | * | 1/1986 |

* cited by examiner

*Primary Examiner*—Robert L. DeBeradinis
(74) *Attorney, Agent, or Firm*—Scully, Scott, Murphy & Presser, P.C.

(57) ABSTRACT

The functionally critical series connection of high-voltage-resistant resistors ($R_n$, $R'_n$) in a Marx generator (11) is replaced according to the invention by a molding (12, 12') composed of conductive plastic, which, depending on the configuration grouping of the capacitor bank ($C_n$), runs over the geometric series of capacitor connections ($A_n$, $A'_n$) resulting from this and is connected to them, for example by riveting or screwing (13), in which case it is also possible to use more than one continuous molding, instead of a single molding.

7 Claims, 1 Drawing Sheet

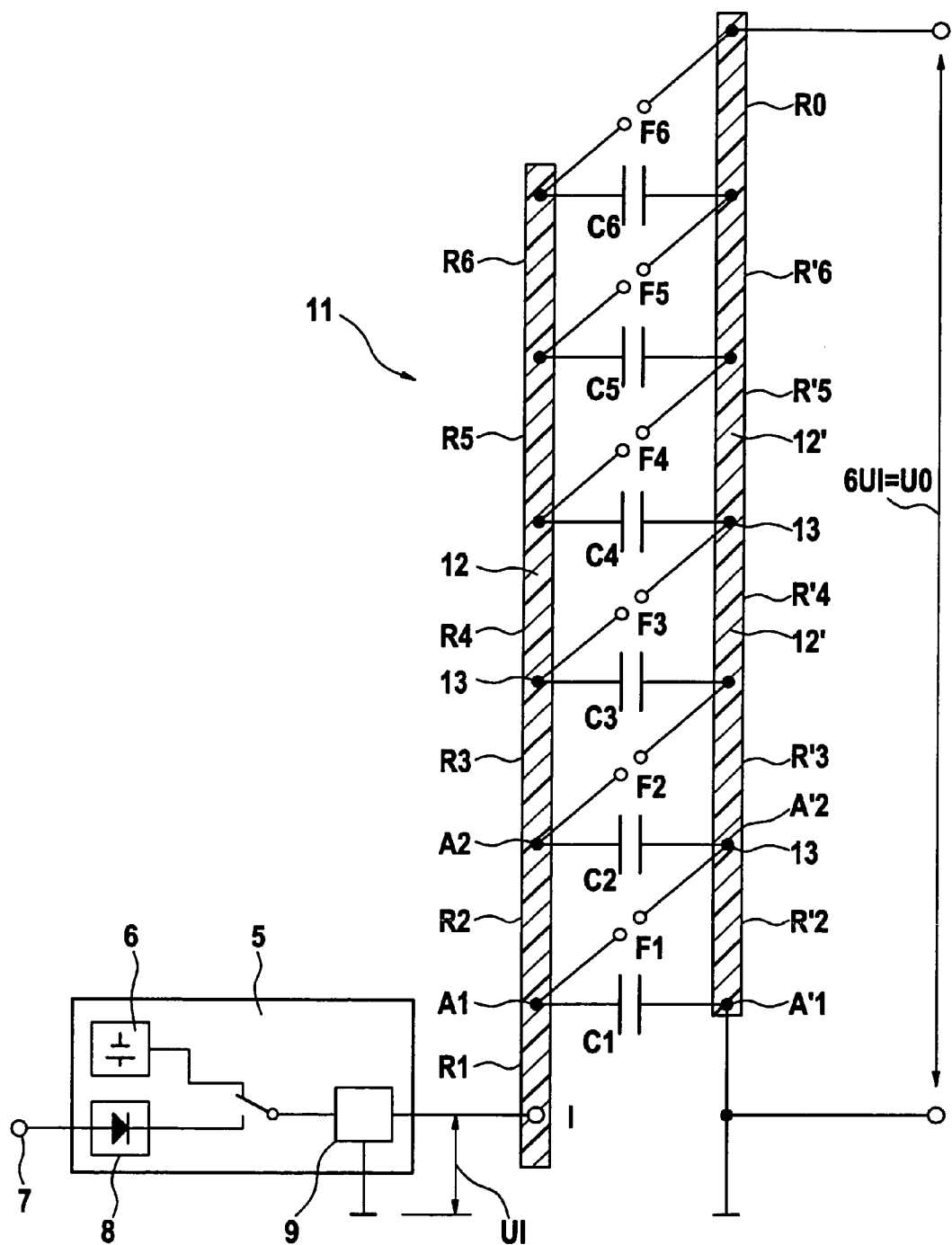

MARX GENERATOR

BACKGROUND OF THE INVENTION

1. Field of the Invention

The invention relates to a Marx generator incorporating a low-cost circuit structure possessing charging and decoupling resistors having long-term resistances to high voltages.

The impulse-voltage generator discovered by Professor Marx (Braunschweig TU) in 1923 is used to produce a high-voltage pulse, for example for insulation-testing purposes, to investigate the behavior of gases in strong electrical fields or, according to DE 101 51 565 A1, to stimulate a resonator to emit high-power microwave energy.

2. Discussion of the Prior Art

The basic function of the Marx generator is based on a capacitor bank having a number n (n=1, 2, 3, . . . , i) of capacitors connected in parallel with one another being charged to a reasonably high input voltage, which is produced by a DC voltage source via an electronic voltage converter, and then being connected in series so that n-times the input voltage is available as the output voltage across this series circuit. In this case, the change from parallel connection to series connection of in each case two successive capacitors in the capacitor bank is carried out by means of a spark gap. When a first of these spark gaps is triggered, then all of the other spark gaps of the capacitor bank ignite virtually at the same time. The response of the first spark gap can be predetermined by means of its response voltage, that is to say by means of the cross-section geometry and the distance between the spark-gap electrodes; alternatively, the response of the first of the spark gaps is initiated by a trigger pulse supplied to it externally. Decoupling resistors, which also act as charging resistors that govern the time constants, prevent one of the two capacitors, between which the spark gap in order to connect them in series is located, being short-circuited as a result of the ignition of the spark gap. In consequence, the series connection of the charging and decoupling resistors when the capacitors are changed to be connected in series acts as a high-voltage voltage divider. High-voltage-resistant resistors must therefore be used in this case, as well, although these are expensive, and their electrical characteristics frequently change in practice, over the course of a lengthy sequence of operating cycles of the Marx generator. This results in the Marx generator not operating in a stable manner over a lengthy time period if it is intended to operate the microwave resonator that has been mentioned virtually quasi-continuously. The withstand voltages of the resistors could admittedly be derated, but this would increase the costs even further and would nevertheless not ensure long-term stable operation.

The present invention is therefore based on the technical problem of using low-cost circuit means to produce a Marx generator whose charging and decoupling resistors have long-term resistance to high voltages.

SUMMARY OF THE INVENTION

According to the invention, no discrete, high-voltage-resistant resistors are any longer soldered in between the individual capacitor stages. However, these series-connected high-voltage-resistant resistors are replaced by a molding composed of electrically conductive plastic, in which case the term plastic also includes conventional plastics, resins, rubber, elastomers, etc. One such molding is commercially available at low cost, for example in the form of a thermoplastic with carbon inserts (graphite particles), silicone with inserts of silver-plated copper, or plastic with metallic fibers aligned longitudinally in it. The electrical behavior of conductive polymers such as these is not dependent on the high-voltage load. Furthermore, as material links which pass over a plurality of contact points that will be made contact with, for example, by rivets or screws on the molding, or through this on an insulating substrate, they are easier to handle than the conventional high-voltage resistors which must be soldered in individually, taking account of protective measures against voltage flashovers.

In the case of a Marx generator, the replacement of the high-voltage resistors by at least one molding composed of conductive plastic thus makes it possible to in each case lay a continuous molding over the two capacitor connections, so that only a single component for the resistive series circuit need be fitted on each side of the capacitor, in which case, it is also possible to provide more than one continuous molding, rather than just one. Depending on the geometric arrangement of the capacitors in the mechanical configuration of the Marx generator, the respective molding composed of conductive plastic may, for example, be linear, U-shaped, O-shaped or may have a complex shape which is matched to the geometric arrangement of the capacitor connections and/or of the resistive series circuit, so that, instead of the large number of resistors to be soldered in, only a single molding composed of conductive plastic need ever be fitted for each geometric configuration, and is connected to the respective connections of the capacitor bank via, for example, contact screws.

BRIEF DESCRIPTION OF THE DRAWING

This is illustrated in more detail in the attached drawing, from whose following explanation, apart from the further claims, additional features and developments of the invention will become evident. The single FIGURE in the drawing shows the outline circuit diagram of a Marx generator in the form of the block arrangement of a capacitor bank, whose capacitors are charged in parallel and are then connected in parallel via light spark gaps.

DETAILED DESCRIPTION OF THE INVENTION

The classic Marx generator 11 has a group of n (n=1, 2, . . . , i), in this case i=6, capacitors Ci, which are initially connected electrically in parallel with one another. Each of these capacitors Ci is thus charged via its charging resistor Ri to an input DC voltage UI, with the charging resistors Ri in fact being connected in series in the form of a voltage divider. A spark gap Fi extends from one capacitor connection Ai of one capacitor Ci to the opposite capacitor connection A'i+1 of the next adjacent capacitor Ci+1 connected in parallel. When this spark gap Fi is ignited (as a result of voltage breakdown or as a result of external initiation), the first connection Ai of the first capacitor Ci is thus connected to the opposite connection A'i+1 of the adjacent capacitor Ci+1, so that this results in the series circuit Ci-Ci+1. The capacitor Ci+1 is not short-circuited via the spark gap Fi because of the charging resistor Ri+1, while a decoupling resistor R'i+1 prevents the capacitor Ci from being short-circuited via its spark gap Fi. The charging constant of the capacitor Ci+1 is thus composed of the series circuit formed by the charging resistors Ri-Ri+1 and the decoupling resistor R'i+1.

The series circuit produced by the spark gap Fi of the two capacitors Ci and Ci+1 which have been charged to the input voltage UI results in the voltage 2×U1, that is to say twice the input voltage, by connecting them in series. The spark gap Fi+1 therefore flashes over virtually immediately as well, and the previous series circuit is raised by the magnitude of the voltage of the next subsequent capacitor $C_{i+2}$, and so on. The output voltage finally produced at the other end of the entire capacitor series circuit is thus $n \times UI = UO$.

The input voltage UI is provided by a voltage source 5 which may be a DC voltage store 6 or an AC power supply system 7 with a rectifier 8. This is expediently followed by a commercially available electronic voltage converter 9, which produces the input voltage UI with a typical order of magnitude of 10 kV.

In order to explain the operation, reference has been made to the circuit sketch in the drawing which shows only a 6-stage Marx generator, although in practice an appropriately large number of capacitors $C_i$ are used to obtain a correspondingly high output voltage UO corresponding to several 10-times to more than 100-times the input voltage UI. A correspondingly large number of high-voltage-resistant resistors $R_i$, $R'_i$ must be soldered in on the one hand between the connections $A_i$-$A_{i+1}$ and on the other hand between the connections $A'_i$-$A'_{i+1}$. This requires a large amount of material and is time-consuming.

In the exemplary embodiment of the invention, a strip of conductive plastic 12 as a molding and composed of a conductive plastic, in which case the term plastic should be understood as meaning not only conventional plastics but also resins, rubber, elastomers, etc. is laid on the two sides of the capacitor bank $C_n$ for each of these resistive series circuits $R_n$, $R'_n$ over the geometric arrangements of the connections $A_n$, $A'_n$ of the capacitors $C_n$, and these are mechanically held, for example, between two insulating mounting panels. The electrical contact between the respective capacitor connection $A_i$ or $A'_i$ and the plastic strip 12, 12' may be made, for example, by means of solder points, by rivets or expediently by contact screws 13, which are screwed through contact lugs on the capacitor connections $A_n$, $A'_n$ into the plastic strip 12 or 12', or are screwed through this into the mounting panel located underneath. In this case, the geometry of the strip 12, 12' follows the profile of the connections $A_n$ and $A'_n$, respectively, so that only a single resistance strip 12 or 12' now need be laid on each side of the capacitor bank $C_n$, instead of a number of high-voltage resistors which must be handled individually, and this strip is then fixed in a force-fitting or interlocking manner, making contact with the capacitor connections $A_n$, $A'_n$.

Thus, in summary, it can be stated that, according to the invention, the functionally critical series connection of high-voltage-resistant resistors $R_n$, $R'_n$ in a Marx generator 11 is replaced by a molding 12, 12' composed of conductive plastic, which, depending on the configuration grouping of the capacitor bank $C_n$, runs over the geometric series of capacitor connections $A_n$, $A'_n$ resulting from this and is connected to them, for example by riveting or screwing, in which case it is also possible to use more than one continuous molding, instead of a single molding.

The invention claimed is:

1. A Marx generator (11) having a number of capacitors ($C_n$), which are charged when connected in parallel via resistors ($R_n$, $R'_n$) upstream of the capacitor connections ($A_n$, $A'_n$) to an input voltage (UI), and are then connected in series with one another via spark gaps ($F_n$), in order to produce n-times the input voltage (UI) as the output voltage (UO), wherein the series-connected resistors ($R_i$-$R_{i+1}$; $R'_i$-$R'_{i+1}$) are each in the form of a molding (12, 12') of an electrically conductive plastic having a long-term resistance to high voltages so as to remain in an essentially unchanged condition, wherein each said plastic molding is laid over the respectively associated connections ($A_n$, $A'_n$) of the capacitors ($C_n$).

2. The Marx generator as claimed in claim 1, wherein the connections ($A_n$, $A'_n$) are connected in a force-fitting or interlocking manner to the molding (12, 12') which is respectively associated therewith.

3. The Marx generator as claimed in claim 2, wherein the connections ($A_n$, $A'_n$) are screwed to the molding (12, 12') which is respectively associated therewith through contact screws (13).

4. The Marx generator as claimed in claim 2, wherein the connections ($A_n$, $A'_n$) are screwed through the respective molding (12, 12') to an insulating mounting panel, which concurrently provides a mechanical retention for the arrangement of capacitors ($C_n$).

5. The Marx generator as claimed in claim 1, wherein each said molding (12, 12') is in the form of a strip.

6. The Marx generator as claimed in claim 1, wherein each said molding (12, 12') is selectively linear, U-shaped or O-shaped.

7. The Marx generator as claimed in claim 1, wherein the series-connected resistors ($R_i$-$R_{i+1}$; $R'_i$-$R'_{i+1}$) are formed by a plurality of moldings.

\* \* \* \* \*